US008658494B2

(12) United States Patent
Frohberg et al.

(10) Patent No.: US 8,658,494 B2
(45) Date of Patent: Feb. 25, 2014

(54) DUAL CONTACT METALLIZATION INCLUDING ELECTROLESS PLATING IN A SEMICONDUCTOR DEVICE

(75) Inventors: Kai Frohberg, Niederau (DE); Juergen Boemmels, Dresden (DE); Matthias Schaller, Moritzburg (DE); Sven Mueller, Wiednitz (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 549 days.

(21) Appl. No.: 12/854,393

(22) Filed: Aug. 11, 2010

(65) Prior Publication Data
US 2011/0049713 A1 Mar. 3, 2011

(30) Foreign Application Priority Data
Aug. 31, 2009 (DE) .......................... 10 2009 039 421

(51) Int. Cl.
*H01L 21/74* (2006.01)
(52) U.S. Cl.
USPC ............................ 438/256; 438/244; 438/157
(58) Field of Classification Search
USPC ......................... 438/157, 256, 244
See application file for complete search history.

(56) References Cited

U.S. PATENT DOCUMENTS

| 6,013,931 | A | 1/2000 | Igarashi et al. |
| 7,622,348 | B2 * | 11/2009 | Pan ............................... 438/241 |
| 7,732,323 | B2 * | 6/2010 | Sung et al. .................... 438/620 |
| 2003/0080429 | A1 | 5/2003 | Matsuoka et al. |
| 2009/0026618 | A1 | 1/2009 | Kim et al. |

FOREIGN PATENT DOCUMENTS

DE 197 39 755 A1 9/1998

OTHER PUBLICATIONS

Translation of Official Communication from German Patent Application No. 10 2009 039 41-.4-33 dated Dec. 22, 2010.

* cited by examiner

*Primary Examiner* — Howard Weiss
*Assistant Examiner* — Tifney Skyles
(74) *Attorney, Agent, or Firm* — Amerson Law Firm, PLLC

(57) ABSTRACT

Contact elements of sophisticated semiconductor devices may be formed for gate electrode structures and for drain and source regions in separate process sequences in order to apply electroless plating techniques without causing undue overfill of one type of contact opening. Consequently, superior process uniformity in combination with a reduced overall contact resistance may be accomplished. In some illustrative embodiments, cobalt may be used as a contact metal without any additional conductive barrier materials.

18 Claims, 6 Drawing Sheets

DUAL CONTACT METALLIZATION INCLUDING ELECTROLESS PLATING IN A SEMICONDUCTOR DEVICE

BACKGROUND OF THE INVENTION

1. Field of the Invention

The present disclosure generally relates to the fabrication of integrated circuits, and, more particularly, to the contact level of a semiconductor device, in which contact areas, such as gate electrodes and drain and source regions, are connected to the metallization system of the semiconductor device on the basis of electrochemical deposition techniques.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. However, the continuing scaling of feature sizes involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain terminal and a source terminal.

On the basis of the field effect transistors, more complex circuit components may be composed, such as inverters and the like, thereby forming complex logic circuitry, memory devices and the like. Due to the reduced dimensions, the operating speed of the circuit components has been increased with every new device generation, wherein, however, the limiting factor of the finally achieved operating speed of complex integrated circuits is no longer the individual transistor element but the electrical performance of the complex wiring fabric, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level, on which the circuit elements are manufactured, but require one or more additional metallization layers, which generally include metal-containing lines providing the inner-level electrical connection, and also include a plurality of inter-level connections, which are also referred to as vias. These interconnect structures comprise an appropriate metal and provide the electrical connection of the individual circuit elements and of the various stacked metallization layers.

Furthermore, to establish a connection of the circuit elements with the metallization layers, an appropriate vertical contact structure is provided, which connects to a respective contact region of a circuit element, such as a gate electrode and/or the drain and source regions of transistors, and to a respective metal line in the metallization layer. The contact structure may comprise contact elements or contact plugs formed in an interlayer dielectric material that encloses and passivates the circuit elements. Upon shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level may have to be provided with appropriate critical dimensions on the same order of magnitude. The contact elements may typically represent plugs, trenches and the like which are formed of an appropriate metal or metal composition, wherein, in sophisticated semiconductor devices, tungsten, in combination with appropriate barrier materials, has proven to be a viable contact metal. When forming tungsten-based contact elements, typically, the interlayer dielectric material may be formed first and may be patterned to receive contact openings, which may extend through the interlayer dielectric material to the corresponding contact areas of the circuit elements. For this purpose, openings of very different depth may have to be formed in the interlayer dielectric material in order to connect to gate electrode structures or any other conductive lines formed above the semiconductor layer, while other contact openings have to be extended down to a semiconductor layer, i.e., any contact areas formed therein. In particular, in densely packed device regions, the lateral size of the drain and source areas and thus the available area for the contact regions may be 100 nm and less, thereby requiring extremely complex lithography and etch techniques in order to form the contact openings with well-defined lateral dimensions and with a high degree of alignment accuracy, while the difference in etch depth may additionally contribute to the overall complexity of the patterning process. After exposing the contact areas, frequently provided in the form of metal silicide regions, a barrier material has to be provided, for instance in the form of a material system including titanium and titanium nitride, wherein the titanium material may provide the required adhesion characteristics, while the titanium nitride material may preserve integrity of the interlayer dielectric material during the subsequent deposition of the tungsten material, which may be accomplished on the basis of sophisticated chemical vapor deposition (CVD) techniques in which a direct contact between silicon dioxide-based materials and the deposition ambient for depositing the tungsten material is to be avoided. Typically, the actual deposition of the tungsten material may be preceded by the deposition of a nucleation layer based on tungsten, which may be accomplished by a dedicated deposition step, after which the actual fill material may be provided. After the deposition of these materials, any excess material may be removed, for instance, by chemical mechanical polishing (CMP), thereby forming the insulated contact elements in the interlayer dielectric material. Although the process sequence for patterning the contact openings and filling these openings with barrier materials and tungsten results in contact elements having a desired contact resistivity for semiconductor devices with critical dimensions of 50 nm, a further reduction of the size of the transistors may result in an increased contact resistivity, which may no longer be compatible with the device requirements. That is, upon further device scaling, the increased contact resistivity, which may result from conventional tungsten-based contact regimes, may represent a limiting factor of the operating speed of the integrated circuits, thereby at least partially offsetting many advantages obtained by the further reduction of the critical dimensions in the device level.

One of the reasons for the inferior contact resistivity in tungsten-based contact technologies is the requirement for barrier materials, possibly in combination with a nucleation layer, which may have an increased resistivity compared to the subsequent tungsten fill material. Since a thickness of the barrier materials and the nucleation layer may not be arbitrarily reduced without jeopardizing the effect of this material system, the amount of less conductive materials relative to the tungsten material may thus increase, thereby over-proportionally contributing to an increased contact resistance. For these reasons, it has been suggested to use other materials or deposition regimes in which the presence of a barrier material of reduced conductivity may be avoided. For example, it has been proposed to use wet chemical deposition techniques, such as the electrochemical deposition in the form of an electroless plating process, in order to fill in an appropriate metal material, thereby obtaining a superior fill behavior in order to avoid the creation of any voids or other deposition-related irregularities, which may frequently be observed in complex CVD-based techniques in which a complex material system may have to be deposited within sophisticated contact openings, in particular when these openings may have very different depths. Although the electroless deposition technique may be very advantageous with respect to the gap-filling capability and the selection of an appropriate contact material, thereby providing the possibility of avoiding any barrier materials, it turns out that, in particular, the different fill heights of the contact openings above gate electrode structures and drain and source regions may contribute to a disadvantageous surface topography after the fill process, which may negatively affect the further processing of the device, as will be described in more detail with reference to FIG. 1.

FIG. 1 schematically illustrates a cross-sectional view of a semiconductor device 100 comprising a substrate 101 and a semiconductor layer 102, such as a silicon-based semiconductor material and the like. The semiconductor layer 102 and the substrate 101 may represent a silicon-on-insulator (SOI) configuration or a bulk configuration in which the semiconductor layer 102 represents a portion of a crystalline semiconductor material of the substrate 101. The semiconductor layer 102 comprises a plurality of semiconductor regions 102A, 102B in combination with isolation structures 102C, such as a shallow trench isolation and the like. It should be appreciated that the semiconductor regions 102A, 102B may also be laterally separated by an isolation structure, depending on the required overall circuit configuration. In the example shown, the semiconductor regions 102A, 102B may represent a substantially continuous semiconductor material in which a plurality of drain and source regions 161 are provided for transistors 160C, 160B. For example, the transistors 160C, 160B may represent closely packed transistor elements of the same conductivity type as may frequently be required in certain device regions, such as RAM areas of a complex logic circuit and the like. The transistors 160B, 160C comprise gate electrode structures 150B, 150C, respectively, which may have the same configuration and which may have substantially the same structure as a conductive line 150A, which may also represent a gate electrode structure when extending to a further semiconductor region, or which may represent an electrical connection so as to electrically connect the semiconductor region 102A or the drain and source region 161 of the transistor 160C with another active region of the semiconductor layer 102. In the following, the conductive line 150A may also be referred to as a gate electrode structure having the same configuration as the gate electrode structures 150B, 150C. When appropriate, the gate electrode structures 150A, 150B, 150C may commonly be referred to as gate electrode structures 150. As illustrated, the gate electrode structures 150 comprise a gate insulation layer 152 that separates an electrode material 151 from the under-lying semiconductor regions 102A, 102B. Furthermore, a metal-containing material 154 is usually provided in the gate electrode structures 150 in order to enhance the overall series conductivity and also reduce contact resistivity of the gate electrode structures 150. In the example shown, the metal-containing regions 154 may be comprised of a metal silicide, such as nickel silicide, nickel/platinum silicide and the like. In this case, the electrode material 151 may comprise a significant portion of silicon material. Furthermore, the gate electrode structures 150 may comprise a spacer structure 153 having any appropriate lateral dimension as required for appropriately defining the dopant profile of the drain and source regions 161 and of metal silicide regions 162, which are usually provided in the drain and source regions 161 in order to reduce the contact resistivity. In the example shown, an additional semiconductor material 102E is provided between the gate electrode structures 150A, 150C, which may thus locally increase the height of the semiconductor layer 102 between the structures 150A, 150C. A corresponding configuration may be advantageous in some cases when a contact is to be established between the gate electrode structure 150A and a drain or source region of the transistor 160C, as will be described later on in more detail. In this case, a metal silicide 163 may be formed in the additional semiconductor region 102E.

Furthermore, an interlayer dielectric material 120 is formed so as to enclose and passivate the gate electrode structures 150 and thus the transistors 160B, 160C, wherein any appropriate composition of materials and material layers may be applied. For example, a silicon nitride-based material 121 may be formed on the gate electrode structures 150, followed by a silicon dioxide-based material and the like. Furthermore, a first contact element 123 is formed in the interlayer dielectric material 120 and extends to a metal-containing region 154, which may also be considered as a contact area of the gate electrode structure 150A. In the example shown, the gate electrode structure 150A may also act as a "local interconnect structure" wherein the gate electrode material 151 may be connected to the semiconductor region 102E and thus to a drain or source region of the transistor 160C. For this purpose, the contact element 123 has appropriate lateral dimensions and a position in order to contact the metal silicide region 163. On the other hand, a second contact element 124 extends to a drain or source region of the transistor 160C, 160B, i.e., to the metal silicide region 162, wherein the lateral dimension of the contact element 124 is appropriately adapted to the overall device geometry, as previously discussed. That is, in sophisticated applications, at least one lateral dimension of the contact element 124, i.e., the horizontal extension in FIG. 1, may be approximately 50 nm and less. The contact elements 123, 124 are comprised of any appropriate material, which may be provided on the basis of electroless plating techniques in order to obtain a desired fill behavior. Furthermore, in some approaches, the contact elements 123, 124 are formed of a metal that may be directly deposited on the regions 154, 163 and 162 in order to provide a highly efficient process flow and to reduce the presence of any barrier materials, which typically have a reduced conductivity compared to the actual contact metal, as discussed above.

The semiconductor device 100 as illustrated in FIG. 1 may be formed on the basis of the following conventional process techniques. After forming the isolation structure 102C and defining the basic conductivity type of the semiconductor regions 102A, 102B, the gate electrode structures 150 are formed by depositing or otherwise forming appropriate materials for the gate insulation layers 152 and depositing one or more electrode materials, such as polysilicon and the like, in combination with other materials that may be required for patterning the resulting layer stack. By means of sophisticated lithography and etch techniques, the electrode material or materials 151 and the gate dielectric material 152 is patterned in accordance with the design rules of the device 100. Thereafter, the drain and source regions 161 may be formed on the basis of the sidewall spacer structure 153, wherein, if required, additional process steps may be performed in order to implement performance increasing mechanisms, such as strain-inducing semiconductor alloys and the like.

If required, the additional semiconductor material 102E may be provided, for instance, by masking the gate electrode structures 150 and exposing a portion between the structures 150A, 150C by means of appropriate lithography and etch techniques. Thereafter, the material 102E may be formed on the basis of selective epitaxial growth techniques, for instance in the form of a silicon/germanium alloy, a silicon material and the like, which may have a desired in situ doping concentration in order to obtain a desired high conductivity. In other cases, the region 102E may not be necessary and the further processing may be continued by forming the metal silicide regions 154, 162 and possibly the region 163 based on conventional silicidation techniques.

Next, the interlayer dielectric material 120 is deposited, for instance by plasma enhanced CVD techniques, thermally activated CVD processes and the like. In the example shown, the layer 121 is deposited, for instance, as a silicon nitride material, followed by the deposition of a silicon dioxide material, which may subsequently be planarized, for instance by CMP. Thereafter, an etch mask is formed by using sophisticated lithography techniques, thereby defining the lateral size and position of contact openings to be formed in the interlayer dielectric material 120. Consequently, during this patterning process, the position of any gate contacts, such as the contact element 123, and other contacts connecting to the semiconductor layer 102, such as the contact element 124, are defined in position and lateral size. In the specific example shown in FIG. 1, the lateral size of the contact element 123 is selected so as to connect to the gate electrode structure 150A and to the semiconductor layer 102, thereby requiring an increased lateral size compared to the contact element 124. A corresponding contact regime may be highly advantageous in memory areas, thereby avoiding additional interconnect structures in the metallization level of the device 100, which is to be formed above the interlayer dielectric material 120 in a further advanced manufacturing stage. On the other hand, providing contact openings with different depth and different lateral size may additionally contribute to a further complexity of the corresponding etch process, which may result in an increased degree of variation of critical dimensions of the contact elements 123, 124. For this reason, the material 102E may be provided in order to cause less non-uniformity during the complex patterning process.

After forming the contact openings so as to expose the regions 154, 163 and 162, acting as contact areas, a contact metal may be deposited on the basis of a wet chemical deposition process such as electroless plating. During an electroless plating process, an appropriate electrolyte solution is provided which may comprise a reducing agent in combination with a salt including the desired metal component in addition to other chemical agents, thereby resulting in the deposition of metal on an appropriate surface, such as a metal-containing material acting as a catalyst material, such as the regions 154, 163 and 162, without requiring the application of an external electrical power. Thus, during the deposition process, the metal material may grow on the contact areas 154, 163, 162 on the basis of an auto catalyst reaction, i.e., contact metal on contact area, wherein, during the further process, an appropriate reducing agent may provide the deposition of contact metal on contact metal. Consequently, substantially the same growth conditions may occur and may result in a different final growth height of the contact elements 123, 124 due to the different start height level, for instance above the gate electrode structure 150A and above the drain and source regions 161. Hence, upon completely filling the contact element 124, a significant local overgrowth of the contact element 123 is caused, as illustrated in FIG. 1. Consequently, the resulting surface topography may require additional process steps for removing any excess material of the contact element 123, which may, however, contribute to contamination of the dielectric material 122, thereby increasing the probability of creating leakage paths and the like. On the other hand, underfilling the contact element 124, i.e., providing the dielectric material 122 with an increased initial thickness in order to provide superior conditions for a subsequent planarization process in order to remove excess material of the dielectric layer in combination with the excess metal of the contact element 123, may be less than desirable since patterning the increased thickness of the dielectric material 122 may result in additional patterning related non-uniformities.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the contact level of sophisticated semiconductor devices may be provided with contact elements formed, for instance, on the basis of electroless plating techniques while avoiding undue overfilling of contact openings and achieving superior fill uniformity. For this purpose, contact elements of different depths may be formed with different process sequences, wherein, in some embodiments, at least the contact element having the greater aspect ratio may be formed on the basis of an electroless plating process. For example, the contact elements connecting to a gate electrode structure or a conductive interconnect line formed above a semiconductor layer may be formed first and thereafter the contact elements of increased depth, which may also typically have reduced lateral dimensions, may be formed in a subsequent process sequence, substantially without affecting the previously formed contact elements. In this manner, a high degree of flexibility is provided in order to select any appropriate deposition technique for the first contact element and/or selecting appropriate contact materials. In some illustrative embodiments disclosed herein, the contact elements of different depths may be formed on the basis of the same contact metal, which may be provided on the basis of electroless plating techniques.

One illustrative method disclosed herein relates to forming contact elements in a semiconductor device. The method comprises forming a first contact opening in an interlayer dielectric material, wherein the first contact opening connects to an electrode material formed adjacent to a first semiconductor region. The method further comprises filling a first metal into the first contact opening so as to form a first contact element. The method further comprises forming a second contact opening in the interlayer dielectric material after forming the first contact element, wherein the second contact opening connects to one of a drain region and a source region formed in a second semiconductor region. Additionally, the method comprises filling a second metal into the second contact opening so as to form a second contact element.

A further illustrative method disclosed herein comprises forming a first contact element in a first portion of an interlayer dielectric material so as to connect to a gate electrode structure of a semiconductor device. Additionally, the method comprises forming a second contact element in a second portion and the first portion of the interlayer dielectric material by performing an electroless plating process after forming the first contact element, wherein the second contact element connects to one of a drain region and a source region of the semiconductor device.

One illustrative semiconductor device disclosed herein comprises a conductive line formed above a semiconductor layer and comprising a first metal-containing contact area. The semiconductor device further comprises a drain region and a source region formed in the semiconductor layer and comprising a second metal-containing contact area. Additionally, an interlayer dielectric material is formed above the semiconductor layer and a first contact element is formed in the interlayer dielectric material and extends from the first contact area to a first height level. Furthermore, the semiconductor device comprises a second contact element formed in the interlayer dielectric material and extending from the second contact area to a second height level that is greater than the first height level, wherein the second contact element comprises a metal fill material that is formed on the second metal-containing contact area.

BRIEF DESCRIPTION OF THE DRAWINGS

The disclosure may be understood by reference to the following description taken in conjunction with the accompanying drawings, in which like reference numerals identify like elements, and in which.

Figure 1:
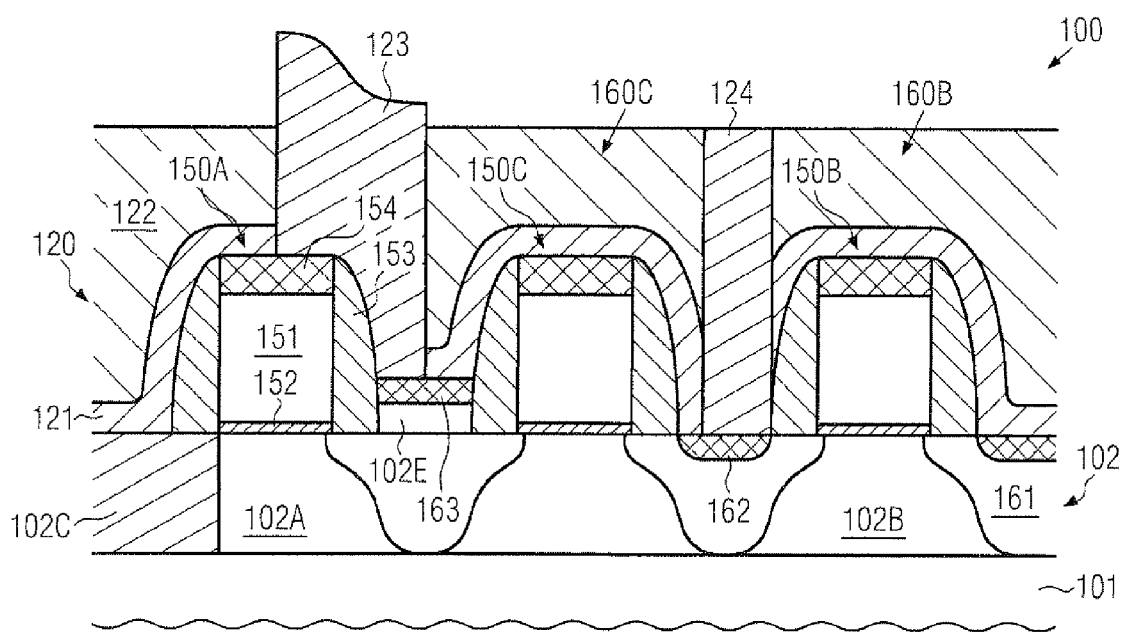
FIG. 1 schematically illustrates a cross-sectional view of a conventional semiconductor device including contact elements formed on the basis of an electroless deposition process, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which contact elements of sophisticated semiconductor devices, i.e., metal-containing regions formed in an interlayer dielectric material positioned between a semiconductor layer and a metallization system of the semiconductor device, are formed such that at least one type of contact openings may be filled by an electroless plating process. For this purpose, contact elements of different depths may be formed on the basis of separate manufacturing sequences, thereby avoiding an undue resulting surface topography, which may typically be obtained upon concurrently filling contact openings of different depths in a common electroless plating process. Due to the superior surface topography for providing each of the different type of contact elements, a high degree of flexibility in selecting an appropriate contact metal may be provided in combination with a high degree of flexibility in using additional fill techniques. In some illustrative embodiments disclosed herein, the contact elements connecting to a gate electrode structure and contact elements of increased depth and connecting to drain and source regions of transistor elements may be filled with the same type of contact metal on the basis of an electroless deposition technique. Furthermore, in some of the embodiments, the contact metal may be provided without any additional barrier materials, thereby resulting in an efficient process flow and providing a reduced contact resistivity, even if a contact fill metal may be used that may have an increased specific resistivity compared to other well-established contact metals, such as tungsten. For example, in some illustrative embodiments, cobalt may be selected as contact metal, which may actually have a higher specific resistivity compared to tungsten, which, however, may be deposited directly on metal silicide surface areas without requiring any additional inter-mediate materials, such as conductive barrier materials, nucleation layers and the like. As a consequence, the resulting contact resistance may be significantly lower compared to tungsten-based contact elements, while also the resulting process sequence may be less complex and the fill behavior may be superior compared to complex CVD-based deposition strategies. In other illustrative embodiments, the contact openings of contact elements connecting to a gate electrode structure may frequently be provided with increased lateral dimensions, for instance when acting as a local interconnect structure for connecting the gate electrode structure to the semiconductor material so that other deposition techniques and contact metals may be applied, while the very critical contact element connecting to the active semiconductor material may be formed on the basis of an electroless plating process. In this manner, well-established contact regimes, however, with less critical process parameters, may be applied to the contact element having increased lateral dimensions.

In some illustrative embodiments, the patterning of particular contact openings having the increased depth may be performed on the basis of an aspect ratio that may be comparable to the etch conditions during a conventional patterning process, while nevertheless the previously formed contact element may be reliably covered by a dielectric material, thereby avoiding any undue influence on this contact element.

With reference to FIGS. 2a-2j, further illustrative embodiments will now be described in more detail, wherein reference may also be made to FIG. 1, if appropriate.

Figure 2A:
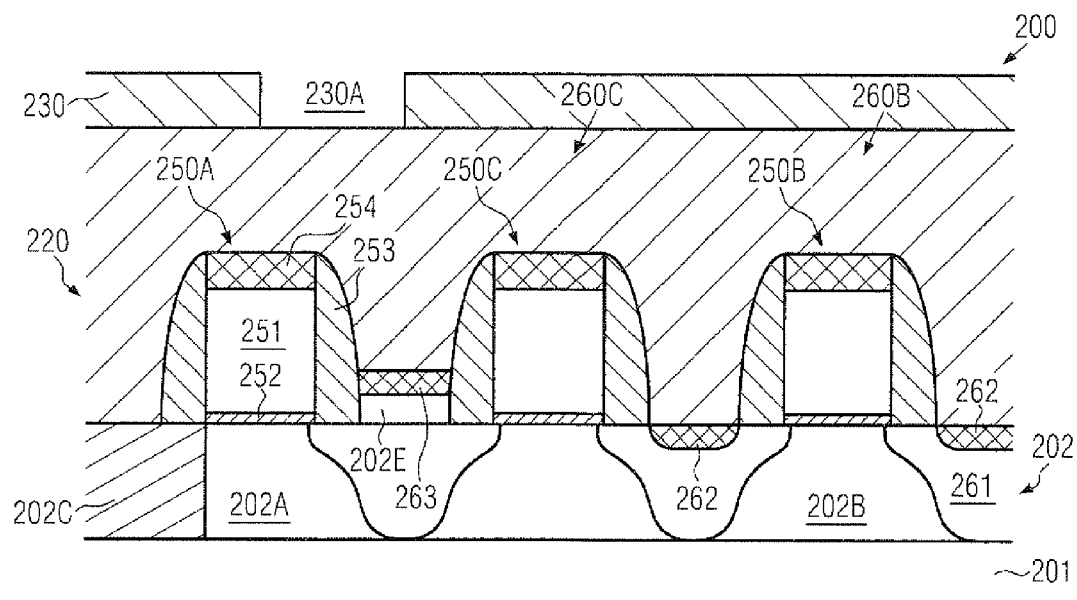
FIGS. 2a-2d schematically illustrate cross-sectional views of a semiconductor device during various manufacturing stages in which a first contact element connecting to a gate electrode structure may be formed, according to illustrative embodiments.

FIG. 2a schematically illustrates a cross-sectional view of a semiconductor device 200 comprising a substrate 201 in combination with a semiconductor layer 202. The semiconductor layer 202 may represent a silicon-based semiconductor material or any other appropriate semiconductor compound which enables forming circuit elements in and above the semiconductor layer 202, such as transistors 260B, 260C. Furthermore, the semiconductor layer 202 and the substrate 201 may form an SOI configuration or a bulk configuration, as is also previously explained. As illustrated, the semiconductor layer 202 may comprise an isolation structure 202C which may delineate semiconductor regions in the layer 202. For example, a first semiconductor region 202A and a second semiconductor region 202B may be delineated by the isolation structure 202C, wherein the regions 202A, 202B may be continuous semiconductor materials or may be separated by any other isolation structure (not shown), depending on the overall device requirements. It should be appreciated that the layer 202 may hereinafter be referred to as a "semiconductor layer," wherein it should be understood that the isolation structure 202C may define isolated "islands" when extending to a buried insulating layer (not shown). The semiconductor layer 202 may comprise, in the regions 202A and 202B, drain and source regions 261 of any appropriate dopant profile as required for obtaining the desired transistor characteristics of the devices 260B, 260C. Furthermore, metal-containing contact areas 262, such as metal silicide regions, may be formed in the drain and source regions 261. In some illustrative embodiments, the semiconductor layer 202 may provide a different height level, for instance between gate electrode structures 250A, 250C, if considered appropriate for the further processing patterning of an interlayer dielectric material 220. For this purpose, an additional semiconductor region 202E may be provided, for instance having substantially the same composition as the semiconductor layer 202. It should be appreciated, however, that the principles disclosed herein may not be restricted to any specific surface topography of the semiconductor layer 202. For example, the region 202E may not be present if unnecessary for the further processing of the device. In other cases, any raised drain and source configurations may be provided for any of the transistors 260B, 260C, while in other cases a recessed drain/source configuration may be applied without restricting applicability of the principles disclosed herein.

It should further be appreciated that the transistors 260B, 260C may have any appropriate configuration in terms of lateral dimensions, conductivity type and the like, wherein, in the example shown, a distance between the transistors may be in the range of approximately 100 nm and significantly less when, for instance, densely packed device regions are considered, as previously explained. Consequently, the gate electrode structures 250B, 250C and also the conductive line 250A, which may also be referred to as a gate electrode structure depending on the overall configuration, as also previously explained with reference to the semiconductor device 100, may have critical dimensions of 50 nm and less. That is, the horizontal extension in FIG. 2a of a gate electrode material 251 may be 50 nm and less. When appropriate, the gate electrode structures 250A, 250B, 250C may commonly be referred to as gate electrode structures 250. Moreover, as previously explained, the gate electrode structures 250 may have a gate dielectric material 252, which may be provided in the form of any appropriate dielectric material which may include a high-k dielectric material, possibly in combination with conventional dielectrics, such as silicon dioxide, silicon oxynitride and the like. It should be appreciated that a high-k dielectric material is to be understood herein as a dielectric material having a dielectric constant of 10.0 or higher. Furthermore, the electrode material 251 may be comprised of one or more materials, possibly including metal-containing materials, depending on the process strategy. Furthermore, contact areas 254, such as metal silicide regions or any other metal-containing materials, may be formed in or above the electrode material 251 so that a portion of the metal-containing materials 254 may act as the actual contact surface for receiving a contact element to be formed in the interlayer dielectric material 220.

With respect to any manufacturing techniques for forming the transistors 260B, 260C and the gate electrode structures 250, the same criteria may apply as previously explained with reference to the semiconductor device 100. As also previously explained, after completing the basis transistor structures, the additional semiconductor region 202E may be formed, if required, and thereafter the metal silicide materials 262 may be formed, possibly also forming a metal silicide 263 in the semiconductor region 202E. It should be appreciated that, during the corresponding silicidation process, the materials 254 may also be formed in the electrode material 251, if considered appropriate and if including a significant amount of silicon. Thereafter, the interlayer dielectric material 220 may be formed so as to enclose the gate electrode structures 250, wherein any appropriate deposition strategy and material composition may be applied. Thereafter, a first etch mask 230 may be formed above the interlayer dielectric material 220 in order to define the lateral position and size of a first contact element to be formed in the interlayer dielectric material 220. In the embodiment shown, an opening 230A of the mask 230 may be positioned partially above the gate electrode structure 250A and partially above the semiconductor layer 202, for instance above the region 202E, when a gate contact structure or local interconnect structure is required so as to connect the gate electrode structure 250A directly to the semiconductor layer 202, i.e., a drain or source region of the transistor 260C, without requiring an additional electrical connection via a metallization system to be formed above the interlayer dielectric material 220. It should be appreciated, however, that any other appropriate lateral size and position may be selected for the opening 230A in order to contact a gate electrode structure as required. The mask 230 may be formed on the basis of sophisticated lithography techniques by using an appropriate lithography mask.

Figure 2B:
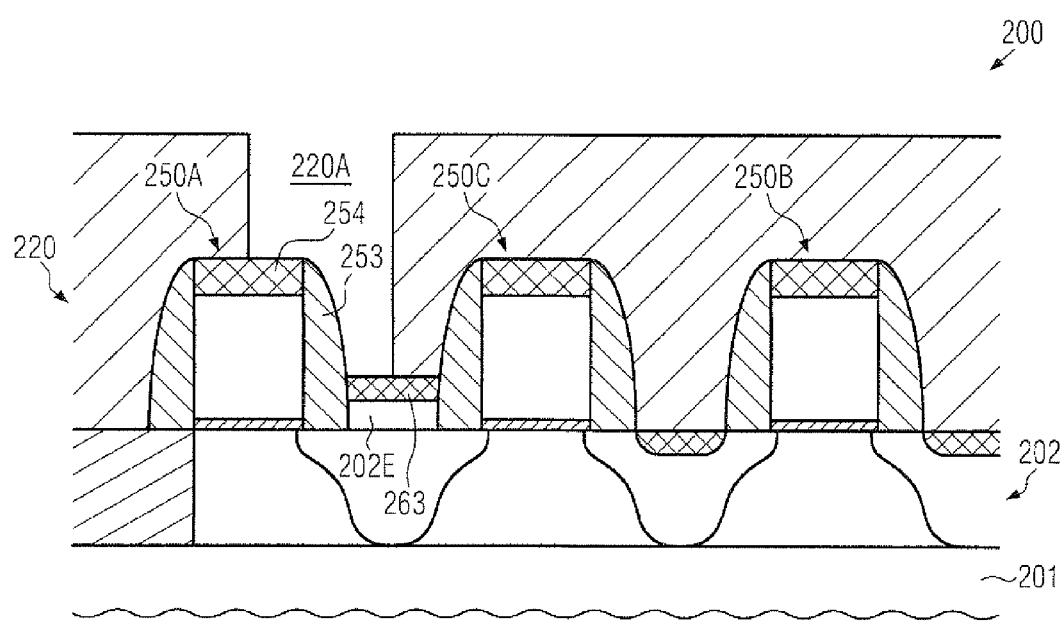

FIG. 2b schematically illustrates the semiconductor device 200 in a further advanced manufacturing stage. As illustrated, a first contact opening 220A is formed in the interlayer dielectric material 220 and may expose at least a portion of the material 254, wherein, as discussed above, in this embodiment, a portion of the material 263 may also be exposed. The contact opening 220A may be formed on the basis of the etch mask 230 (FIG. 2a) by applying well-established anisotropic etch recipes in which the dielectric material 220 may be removed and, at least during a final phase of the etch sequence, the materials 254 and 263 may act as an efficient etch stop material. As previously explained with reference to the semiconductor device 100, any appropriate material composition including etch stop materials and the like may be incorporated into the dielectric material 220 in order to achieve a reliable etch sequence. As previously discussed, if a local interconnect structure is to be formed on the basis of the contact opening 220A, the region 202E may not necessarily be provided in other embodiments since other contact elements having a more critical aspect ratio may be formed in a separate patterning sequence so that the opening 220A may also extend down to the semiconductor layer 202 as initially provided.

Figure 2C:
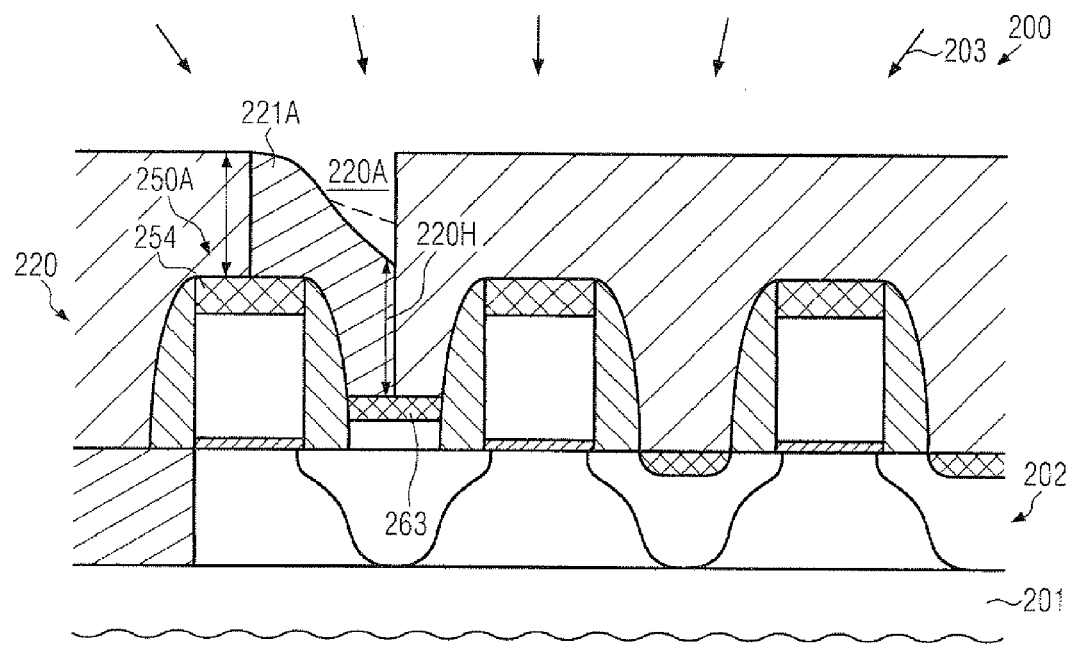

FIG. 2c schematically illustrates the semiconductor device 200 during a deposition process 203 in order to fill in a contact metal 221A into the opening 220A. In one illustrative embodiment, the deposition process 203 may be performed as a wet chemical deposition process, such as an electroless plating process, thereby depositing the material 221A with a high degree of selectivity within the opening 220A, while substantially avoiding any deposition of this material on horizontal surface areas of the interlayer dielectric material 220. For this purpose, the exposed portions of the materials 254, 263 may act as a catalyst material for initiating the deposition of metal, wherein the further deposition may be initiated by additional chemical agents contained in the wet chemical solution used during the deposition process 203. For this purpose, a plurality of well-established deposition recipes are available for a plurality of materials. In one illustrative embodiment a cobalt material may be deposited, which may be accomplished without using any additional barrier materials and the like, so that the fill material 221A may be formed directly on the exposed portions of the materials 254 and 263. Consequently, the resulting series resistance of the material in the opening 220A may be defined by the specific resistivities of the materials 254, 263 in combination with the material 221A, contrary to sophisticated tungsten-based contact regimes in which additionally barrier materials and nucleation layers may have a significant effect on finally obtained contact resistance. It should be appreciated that, during the deposition process 203, a different fill height may be created if different height levels may be present in the contact opening 220A, as shown in FIG. 2c, wherein, however, a minimum fill height 220H in the opening 220A may be selected such that a height level for a corresponding contact element may be obtained after performing a planarization process. For this purpose, any excess height of the interlayer dielectric material 220 above the gate electrode structure 250A and the actual fill height during the deposition process 203 may be appropriately adapted in order to obtain a target height level of a contact element.

In other illustrative embodiments, the deposition process 203 may be performed on the basis of any other process technique, such as CVD and the like, if considered appropriate in providing a specific type of material, such as tungsten and the like. Due to the less critical aspect ratio of the opening 220A, in this case, a superior fill behavior may also be accomplished, thereby forming reliable contact elements with a desired low contact resistance.

Figure 2D:
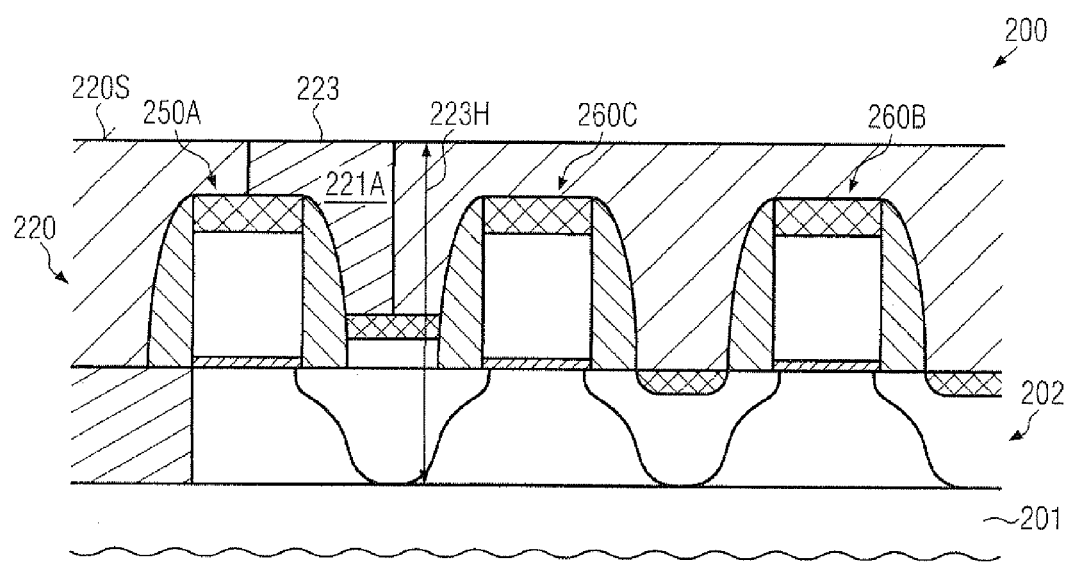

FIG. 2d schematically illustrates the semiconductor device 200 in a further advanced manufacturing stage in which a substantially planar surface 220S may be provided, for instance on the basis of any planarization process, such as a CMP process, thereby also forming a first contact element 223 including the contact metal 221A. As previously explained, a height level 223H of the contact element 223 may be adjusted on the basis of the initial thickness of the interlayer dielectric material 220 in combination with deposition parameters and the degree of material erosion during the corresponding planarization process for obtaining the surface 220S. It should be appreciated that, during the planarization of the interlayer dielectric material 220S comprising the contact metal 221A, stable process conditions may be encountered since the metal 221A may be embedded in the dielectric material of layer 220.

Figure 2E:
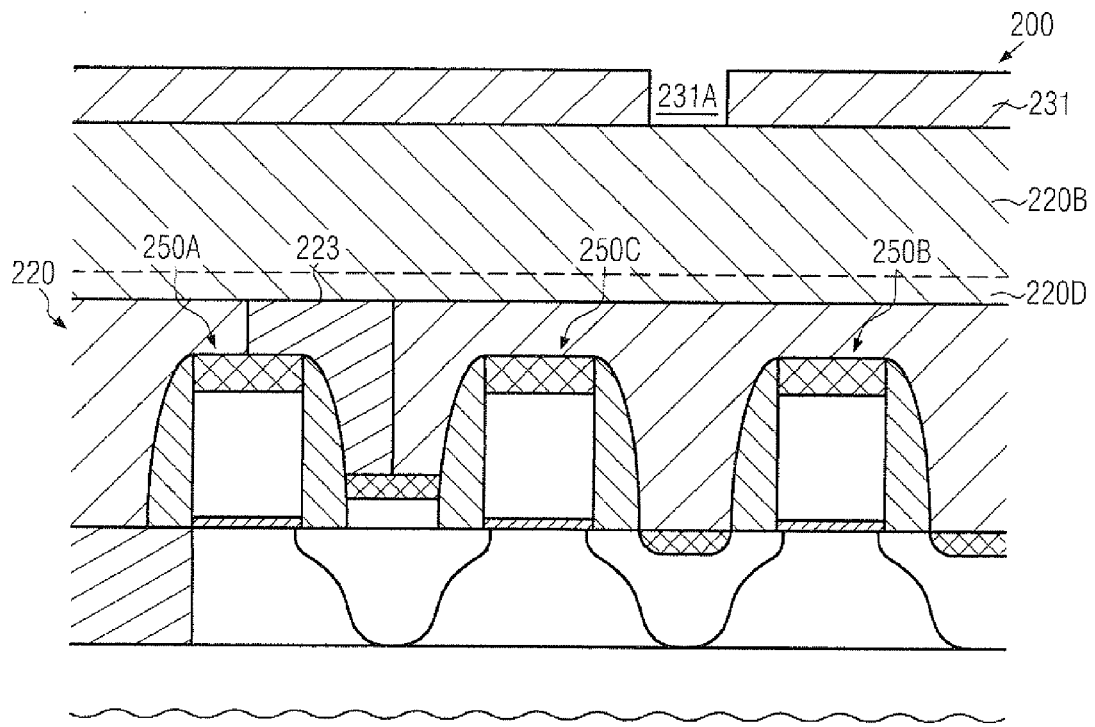
FIGS. 2e-2i schematically illustrate cross-sectional views of the semiconductor device in further advanced manufacturing stages in forming a second contact element without affecting the first contact element, according to illustrative embodiments.

FIG. 2e schematically illustrates the semiconductor device 200 with a further dielectric material 220B formed above the interlayer dielectric material 220 followed by a further etch mask 231, which may comprise an opening 231A that defines the lateral size and position of a contact opening to be formed in the materials 220B and 220. As previously explained, the opening 231A may thus have an appropriate lateral dimension, for instance of approximately 50 nm and less, depending on the dimensions of the gate electrode structures 250C, 250B and the spacing between these components. The material 220B may be formed on the basis of any appropriate deposition technique, wherein, if required, additional materials 220D in the form of an etch stop material and the like may be provided. For instance, the material 220B may be provided in the form of a silicon dioxide material which may have substantially the same material composition as at least a significant portion of the interlayer dielectric material 220. In one illustrative embodiment, as illustrated, the layer 220B may be provided with a thickness that may be equal to or greater than a thickness of the interlayer dielectric material 220 so as to enable the patterning of the layer 220 while using the layer 220B as a mask layer, which may be "consumed" when etching into and through the material 220, thereby substantially not unduly increasing an aspect ratio during the patterning of the layer 220. The etch mask 231 may be formed on the basis of well-established lithography and patterning strategies using a correspondingly adapted lithography mask.

Figure 2F:
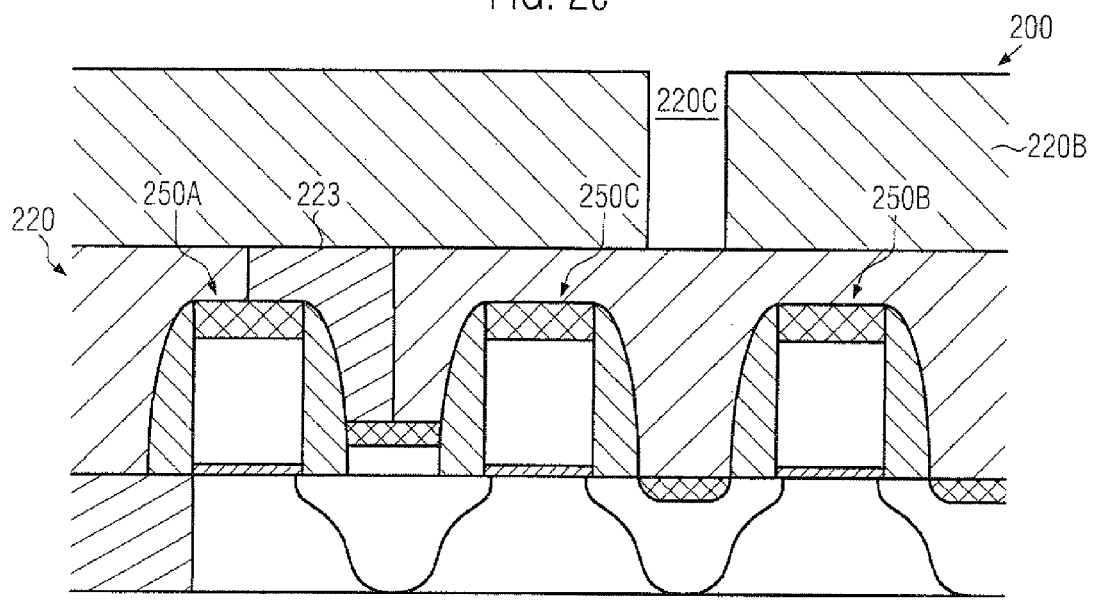

FIG. 2f schematically illustrates the semiconductor device 200 in a further advanced manufacturing stage. As shown, a part of a second contact opening 220C may be formed in the dielectric layer 220B and the etch mask 231 (FIG. 2e) may be removed. The opening 220C may be formed on the basis of any appropriate anisotropic etch recipe, for instance for etching silicon dioxide, wherein, if required, the etch process may be controlled on the basis of an etch stop material, such as the layer 220D (FIG. 2e). Consequently, the first part of the opening 220C may be formed on the basis of similar process conditions as are typically encountered when patterning the interlayer dielectric material of the contact level. That is, in the example shown in FIG. 2f, the interlayer dielectric material 220 has a specific thickness in accordance with device requirements, wherein a lateral dimension of the contact opening 220C may thus result in a specific aspect ratio. By selecting a similar thickness for the material 220B, a similar aspect ratio is encountered during the preceding etch process for forming the opening 220C so that this etch process may not contribute to an increased etch complexity. Moreover, as previously explained with reference to the semiconductor device 100, contact openings of increased lateral dimensions may not have to be formed concurrently with the opening 220C, thereby enhancing overall etch uniformity.

After removal of the etch mask 231 (FIG. 2e), the further processing may be continued by "transferring" the opening 220C into the interlayer dielectric material 220. At the same time, the material of the layer 220B may be consumed during the etch process due to a similar etch rate of the materials 220 and 220B.

Figure 2G:
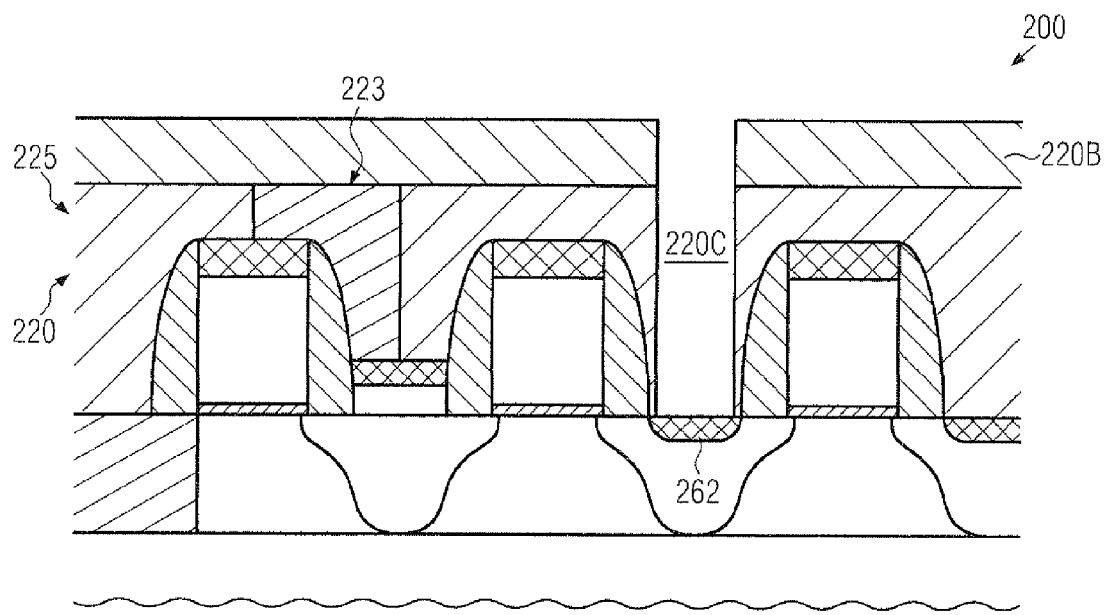

FIG. 2g schematically illustrates the semiconductor device 200 with a reconfigured interlayer dielectric material 225, which may also be referred to as a contact level of the device 200, in which the previously provided interlayer dielectric material 220 in combination with a residue of the material 220B may be provided. Furthermore, the contact opening 220C may be formed in the material 220 and may extend to a portion of the material 262, which may act as a contact area during the subsequent electrochemical deposition of a contact metal. On the other hand, the dielectric layer 220B may reliably cover the contact element 223, thereby avoiding any undue interaction during the further processing. The contact opening 220C may be formed on the basis of well-established etch techniques, wherein, as will be explained later on in more detail, an additional etch stop layer in the material 220 may be used for controlling the etch process, if required.

Figure 2H:
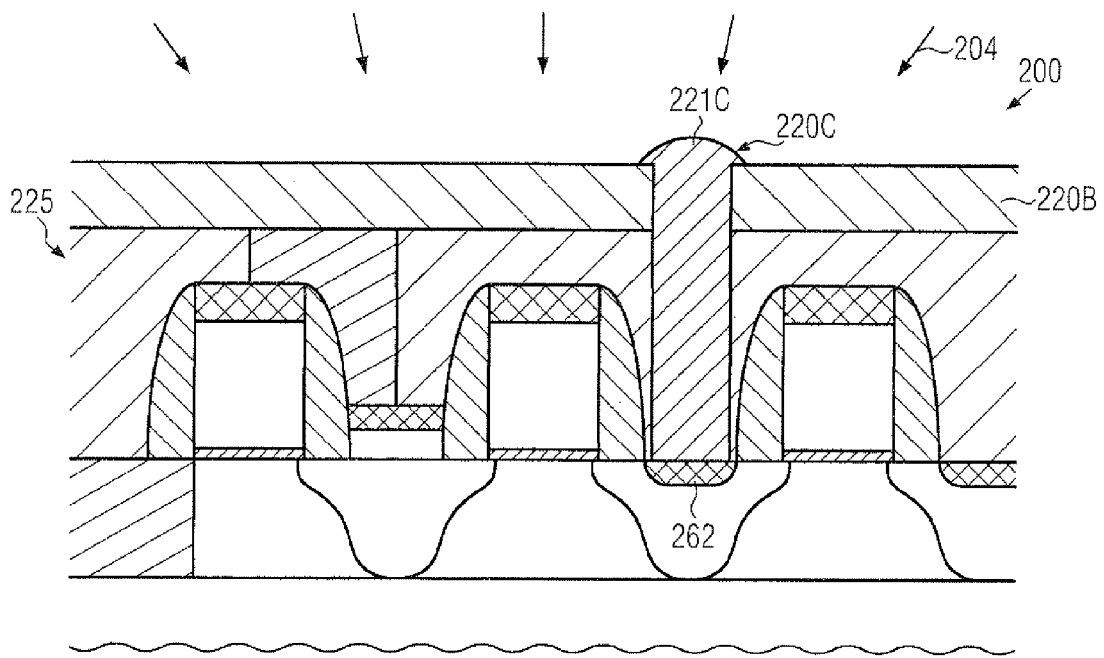

FIG. 2h schematically illustrates the semiconductor device 200 during a further deposition process 204, which may be performed as an electroless plating process, thereby selectively depositing a further contact metal 221C in the opening 220C. In one illustrative embodiment, the contact metal 221C may be provided without any additional conductive barrier materials, thereby forming the material 221C directly on the material 262. In this manner, the overall series resistance of the contact metal 221C in the opening 220C in combination with the contact area 262 may be maintained at a low level compared to other strategies in which a conductive barrier material may be provided, at least at sidewalls of the opening 220C. In one illustrative embodiment, the contact metal 221C may be comprised of cobalt, which may be readily formed directly on a metal silicide region, such as the region 262, by providing superior deposition conditions, while at the same time the series resistance may be less compared to a tungsten-based contact element having the same dimensions. It should be appreciated, however, that other appropriate materials may be provided in the opening 220C if a desired low series resistance may be accomplished. For example, highly conductive materials, such as copper, may be formed in the opening 220C when the opening may be formed in a dielectric material having the required copper diffusion blocking effect. Furthermore, in this case, a conductive barrier layer may be selectively formed in or on the region 262, for instance by an electrochemical deposition technique, thereby providing desired copper confinement while obtaining reduced series resistance since a thin conductive barrier layer with a moderately high conductivity may be used, while the remaining volume of the opening 220C may be filled with a highly conductive copper.

Figure 2I:
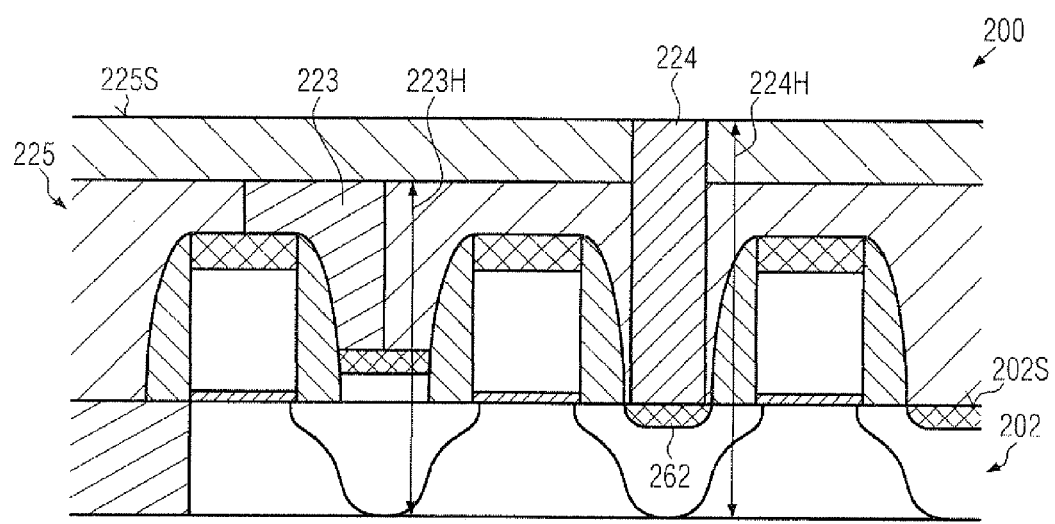

FIG. 2i schematically illustrates the semiconductor device 200 in a further advanced manufacturing stage in which the surface 225S of the contact level may be planarized, thereby providing a second contact element 224. The planarization may be accomplished on the basis of CMP and the like, wherein it should be appreciated that the fill height in the opening 220C (FIG. 2h) may be less critical since the material 221C (FIG. 2h) may be embedded in the dielectric material of the contact level 225. As shown in FIG. 2h, a slight overfill may be applied, while in other cases a certain degree of underfill may also be used, depending on the overall process strategy. Thus, the contact element 224 may be provided with an increased height level 224H compared to the height level 223H of the contact element 223, which is still covered by a portion of the dielectric material 225. It should be appreciated that the height levels 223H, 224H may be referenced to any appropriate surface, such as a surface 202S of the semiconductor layer 202.

Figure 2J:
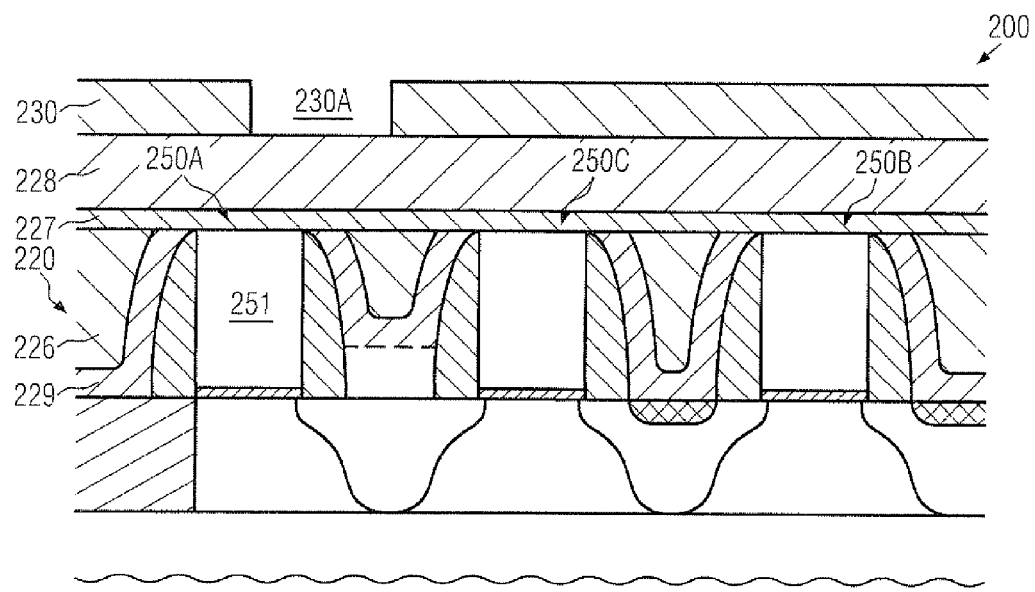
FIG. 2j schematically illustrates a cross-sectional view of the semiconductor device according to further illustrative embodiments in which an interlayer dielectric material may be provided on the basis of etch stop materials in order to obtain superior conditions during the sequential patterning of contact openings.

FIG. 2j schematically illustrates the semiconductor device according to further illustrative embodiments in which the interlayer dielectric material 220 may be provided in the form of a layer system comprising two or more different materials. For example, as illustrated, an etch stop layer 229 may be formed on the gate electrode structures 250, for instance in the form of a silicon nitride material and the like. Furthermore, a dielectric fill material 226, such as a silicon dioxide material, may be formed laterally adjacent and between the gate electrode structures 250, followed by a further etch stop layer 227, such as a silicon nitride layer and the like. Furthermore, a further dielectric material 228 in the form of a silicon dioxide material and the like may be provided above the etch stop material 227.

The interlayer dielectric material 220 as illustrated in FIG. 2j may be formed in accordance with process techniques in which the etch stop material 229 may be formed on the basis of plasma enhanced deposition techniques, followed by the deposition of the fill material 226, which may be applied on the basis of a deposition process having superior gap fill capabilities. For instance, silicon dioxide material may be deposited on the basis of sub-atmospheric CVD or high density plasma CVD techniques in which sophisticated surface topographies, as caused by the gate electrode structures 250 in densely packed device regions, may be reliably filled with material. Thereafter, the material 226 may be planarized, thereby possibly exposing the electrode material 251 of the gate electrode structures 250. In some sophisticated approaches, the electrode material 251 may be replaced by a material of superior conductivity, which may be accomplished on the basis of selective etch techniques and appropriate deposition strategies. In this manner, superior metal gate electrode structures including a high-k dielectric material may be provided in a late manufacturing stage, i.e., after completing the basic transistor structures. Next, the etch stop material 227 may be deposited, followed by the deposition of the material 228. Thereafter, the interlayer dielectric material 220 may be patterned on the basis of the etch mask 230 by etching through the material 228 and using the etch stop layer 227 as a control material, which may subsequently be opened in order to expose the electrode material 251, which may now comprise a metal-containing material, which may also act as an efficient contact area. If required, the etch process may be continued so as to etch through the material 226 between the gate electrode structures 250A, 250C, as previously discussed. Thereafter, the further processing may be continued by removing the etch mask 230 and filling the resulting opening with a desired contact metal, for instance on the basis of an electroless plating technique, as previously explained. Thereafter, the further processing may be continued as described above, that is, the contact element may be formed and thereafter a further dielectric material may be deposited and may be patterned, wherein the etch stop layer 227 is used for stopping the etch process. Thereafter, the etch stop layer 227 may be opened and the material 226 may be etched, as is similarly shown in FIG. 2g. Finally, the etch stop layer 229 may be opened and the resulting opening may be filled with a contact metal, as is also described with reference to FIG. 2h.

As a result, the present disclosure provides semiconductor devices and manufacturing techniques in which contact elements of different depth may be formed separately, thereby allowing the application of efficient electroless plating processes without causing undue overfilling of contact openings. Furthermore, superior conditions during the patterning of the individual contact openings may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming contact elements in a semiconductor device, the method comprising:
   forming a first contact opening in an interlayer dielectric material, said first contact opening connecting to an electrode material formed adjacent to a first semiconductor region;
   filling a first metal into said first contact opening so as to form a first contact element;
   after forming said first contact element, forming a dielectric material layer having a first thickness above said interlayer dielectric material;
   forming an opening in said dielectric material layer;
   while using said dielectric material layer as an etch mask, performing an etching process on said interlayer dielectric material through said opening in said dielectric material layer so as to form a second contact opening in said interlayer dielectric material, said second contact opening connecting to one of a drain region and a source region formed in a second semiconductor region, wherein performing said etching process so as to form said second contact opening consumes a portion of said dielectric material layer such that it has a second thickness that is less than said first thickness; and
   filling a second metal into said second contact opening so as to form a second contact element.

2. The method of claim 1, wherein forming at least one of said first and second contact elements comprises performing a wet chemical deposition process.

3. The method of claim 2, wherein said first and second contact elements are formed by performing a wet chemical deposition process.

4. The method of claim 1, wherein said interlayer dielectric material and said dielectric material layer are formed so as to have substantially the same material composition.

5. The method of claim 1, wherein said step of filling said second metal in said second contact opening is performed while using said dielectric material layer as a mask that covers said first contact element when filling said second metal in said second contact opening.

6. The method of claim 1, wherein said first metal and said second metal represent the same type of metal material.

7. The method of claim 1, wherein said first and second metals are different in material composition and wherein at least said second metal is filled in by performing a wet chemical deposition process.

8. The method of claim 1, wherein said first contact opening is formed so as to connect to said first semiconductor region.

9. The method of claim 2, wherein performing a wet chemical deposition process comprises performing an electroless plating process by depositing a metal directly on a contact area exposed by at least one of said first and second contact openings.

10. The method of claim 9, wherein said electroless plating process is performed so as to deposit cobalt.

11. A method, comprising:
    forming a first contact element in a first contact opening formed in an interlayer dielectric material so as to connect to a gate electrode structure of a semiconductor device;
    after forming said first contact element, forming a dielectric material layer having a first thickness above said interlayer dielectric material;
    patterning said dielectric material layer to form patterned dielectric material layer having an opening therein;
    while using said patterned dielectric material layer as an etch mask, performing an etching process on said interlayer dielectric material so as to form a second contact opening that exposes one of a source region or a drain region of said semiconductor device wherein said second contact opening is substantially aligned with said opening formed in said patterned dielectric material layer and wherein performing said etching process so as to form said second contact opening consumes a portion of said dielectric material layer such that it has a second thickness that is less than said first thickness;
    after forming said second contact opening, forming a second contact element in said opening in said patterned dielectric material layer and in said second contact opening in said interlayer dielectric material by performing an electroless plating process.

12. The method of claim 11, wherein said first contact element is formed by performing another electroless plating process.

13. The method of claim 11, wherein said interlayer dielectric material and said patterned dielectric material layer are formed so as to have substantially the same material composition.

14. The method of claim 11, wherein performing said electroless plating process comprises depositing a metal directly on a contact area of said one of a drain region and a source region.

15. The method of claim 14, wherein said metal comprises cobalt.

16. The method of claim 12, wherein performing said another electroless plating process comprises forming a metal directly on a contact area of said gate electrode structure.

17. The method of claim 16, wherein said metal deposited during said another electroless plating process comprises cobalt.

18. The method of claim 11, wherein said second contact element has at least one lateral dimension that is approximately 50 nm or less.

\* \* \* \* \*